(12) United States Patent
Gan

(10) Patent No.: US 11,417,645 B2
(45) Date of Patent: Aug. 16, 2022

(54) ELECTROSTATIC DISCHARGE PROTECTION STRUCTURE IN A SEMICONDUCTOR DEVICE

(71) Applicant: SEMICONDUCTOR MANUFACTURING INTERNATIONAL (SHANGHAI) CORPORATION, Shanghai (CN)

(72) Inventor: Zhenghao Gan, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 15 days.

(21) Appl. No.: 15/008,737

(22) Filed: Jan. 28, 2016

(65) Prior Publication Data

US 2016/0225757 A1  Aug. 4, 2016

(30) Foreign Application Priority Data

Feb. 2, 2015  (CN) .......................... 201510053595.1

(51) Int. Cl.
*H01L 27/02* (2006.01)
*H01L 27/06* (2006.01)
*H01L 29/78* (2006.01)

(52) U.S. Cl.
CPC ........ *H01L 27/0623* (2013.01); *H01L 27/027* (2013.01); *H01L 29/7835* (2013.01)

(58) Field of Classification Search
CPC .............. H01L 21/8249; H01L 21/761; H01L 29/7816; H01L 2924/1305
See application file for complete search history.

(56) References Cited

U.S. PATENT DOCUMENTS

| | | | | |
|---|---|---|---|---|
| 6,072,677 A | * | 6/2000 | Chen | ................... H01L 27/0251 361/111 |
| 2003/0052332 A1 | * | 3/2003 | Chen | ................... H01L 27/0262 257/173 |
| 2007/0058307 A1 | * | 3/2007 | Mergens | ............. H01L 29/7436 361/56 |
| 2008/0116480 A1 | * | 5/2008 | Glenn | ................. H01L 27/0262 257/E21.388 |
| 2009/0213507 A1 | * | 8/2009 | Chen | ................... H01L 27/0285 361/56 |
| 2014/0302647 A1 | * | 10/2014 | Bobde | ................. H01L 27/0259 438/204 |

(Continued)

*Primary Examiner* — Marcos D. Pizarro
*Assistant Examiner* — Quinton A Brasfield
(74) *Attorney, Agent, or Firm* — Anova Law Group, PLLC

(57) ABSTRACT

An electrostatic discharge protection structure includes a laterally diffused metal oxide semiconductor (LDMOS) device. The LDMOS device includes an embedded bipolar junction transistor. A gate, a source, a buried layer lead-out area, and a substrate lead-out area of the LDMOS device are grounded. A drain and a body region lead-out area of the LDMOS device are electrically connected to a pad input/output terminal. In an embodiment, the embedded bipolar junction transistor includes a PNP transistor operative to transmit a reverse electrostatic discharge current. An N+ drain, a gate, an N+ source, and a P+ substrate lead-out area form a grounded-gate NMOS (GGNMOS) operative to transmit a forward electrostatic discharge current.

12 Claims, 2 Drawing Sheets

(56) References Cited

U.S. PATENT DOCUMENTS

| | | | | |
|---|---|---|---|---|
| 2014/0367783 A1* | 12/2014 | Hwang | ............... | H01L 27/0259 257/577 |
| 2015/0255595 A1* | 9/2015 | Hebert | ................ | H01L 27/0922 438/286 |

* cited by examiner

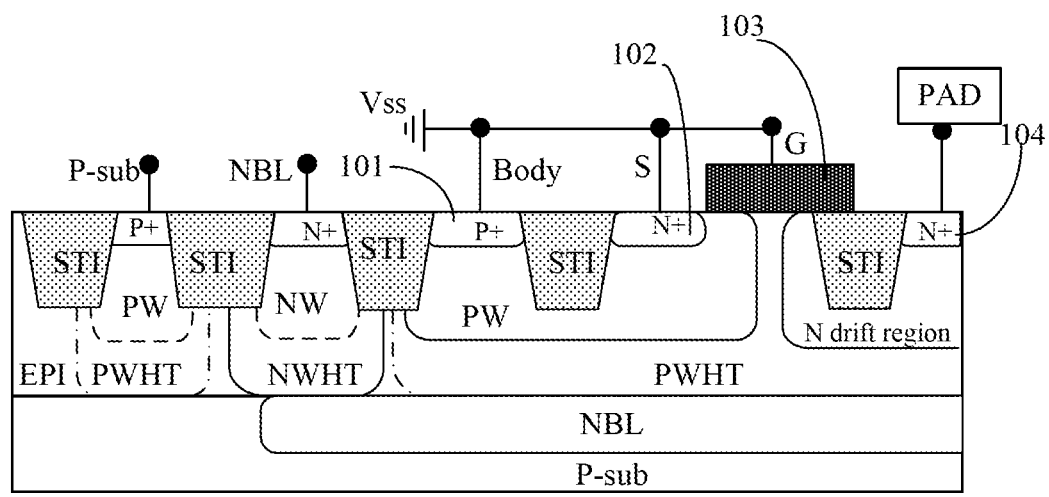
FIG. 1A
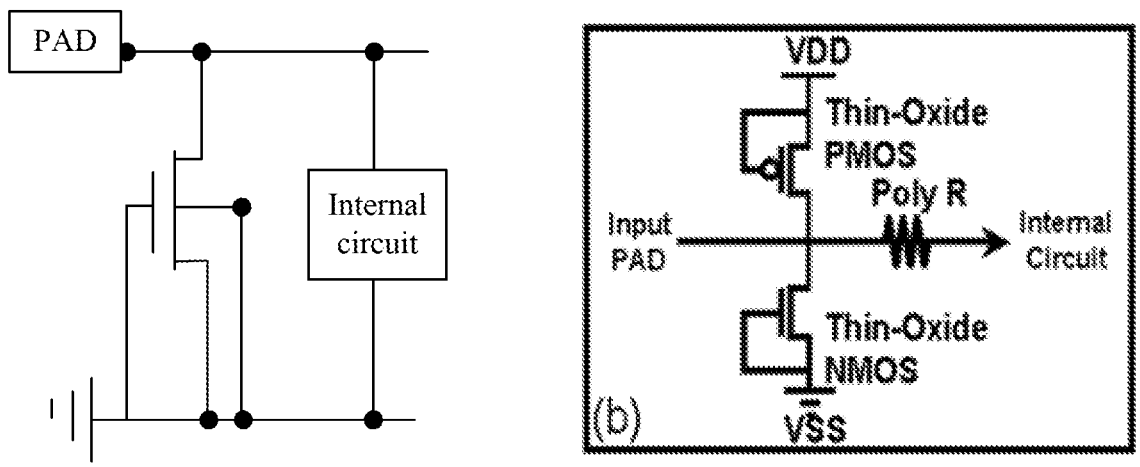
FIG. 1B
FIG. 1C

ELECTROSTATIC DISCHARGE PROTECTION STRUCTURE IN A SEMICONDUCTOR DEVICE

CROSS-REFERENCES TO RELATED APPLICATIONS

This application claims priority to Chinese patent application No. 201510053595.1, filed on Feb. 2, 2015, the content of which is incorporated herein by reference in its entirety.

BACKGROUND OF THE INVENTION

The present invention relates to semiconductor technologies, more particularly to an electrostatic discharge protection structure in a semiconductor device.

In the integrated circuit chip manufacturing and the final application systems, with the continuing improvement of the VLSI technology, the current complementary metal oxide semiconductor (CMOS) integrated circuit design has entered the ultra-deep submicron stage. The size of MOS devices continue to shrink. Electrostatic discharge (ESD) poses a more and more significant harm to integrated circuits. According to statistics, 35 percent of the product failure in integrated circuits is due to ESD problems. Thus, ESD protection becomes especially important in integrated circuit design.

Currently, the ESD protection schemes used in high-voltage circuits usually employ a self-protection scheme. That is, the circuit to be protected itself has certain ESD protection capacity; no additional ESD protection measures are needed. FIG. 1A illustrates a schematic cross-sectional view of a conventional gate-grounded N-type laterally diffused metal oxide semiconductor field effect transistor (GG-NLDMOS). The gate 103, the source 102, and the body region lead-out area 101 of the NLDMOS device are grounded; the drain 104 is electrically connected to the input/output pad, thereby reducing the potential damage caused by static electricity on the integrated circuit. FIG. 1B shows an equivalent circuit diagram for the GGNLDMOS shown in FIG. 1A. However, with the continuing development of semiconductor technologies, the sizes of transistors are significantly reduced, resulting in a significant reduction of self-protection capability of the LDMOS device against ESD.

In order to make a device more robust, usually an additional ESD protection device is added in an integrated circuit for transmitting a reverse ESD current. In view of this, a type of GGMOS devices that can transmit both forward and reverse ESD currents has emerged. FIG. 1C shows an equivalent circuit diagram for a conventional electrostatic discharge protection structure in a GGMOS device. The device uses a GGNMOS for transmitting a forward ESD current, and uses a GDPMOS for transmitting a reverse ESD current. However, adding an additional ESD protection device will increase the size of the semiconductor chip.

Therefore, there is a need to improve the electrostatic protection capability of high voltage LDMOS devices without increasing the chip size.

SUMMARY OF THE INVENTION

In one aspect of the present invention, an electrostatic discharge protection structure includes a laterally diffused metal oxide semiconductor (LDMOS) device. The LDMOS device includes an embedded bipolar junction transistor. A gate, a source, a buried layer lead-out area, and a substrate lead-out area of the LDMOS device are grounded. A drain and a body region lead-out area of the LDMOS device are electrically connected to a pad input/output terminal.

According to an embodiment, the embedded bipolar junction transistor includes a PNP transistor, and the LDMOS device includes an NLDMOS device.

According to an embodiment, the NLDMOS device includes: a P-type substrate; an N-type buried layer formed in the P-type substrate; an epitaxial layer formed on the N-type buried layer; an N deep well, a first P deep well, and a second P deep well formed in the epitaxial layer; a first P well and an N-type drift region formed in the first P deep well, the first P well and the N-type drift region separated from each other; a P+ body region lead-out area and an N+ source formed in the first P well; an N+ drain formed in the N-type drift region; an N well formed in the N deep well; an N+ buried layer lead-out area formed in the N well; a second P well formed in the second P deep well; a P+ substrate lead-out area formed in the second P well; and a gate formed on the epitaxial layer between the first P well and the N-type drift region.

According to an embodiment, the P+ body region lead-out area forms the collector of the PNP transistor, the N+ buried layer lead-out area forms the base of the PNP transistor, and the P+ substrate lead-out area forms the emitter of the PNP transistor.

According to an embodiment, the PNP transistor is operative to transmit a reverse electrostatic discharge current.

According to an embodiment, the N+ drain, the gate, the N+ source, and the P+ substrate lead-out area form a grounded-gate NMOS (GGNMOS).

According to an embodiment, the GGNMOS is operative to transmit a forward electrostatic discharge current.

In another aspect of the present invention, an electronic apparatus includes an electrostatic discharge protection structure, and an electronic component assembly coupled to the electrostatic discharge protection structure. The electrostatic discharge protection structure includes a laterally diffused metal oxide semiconductor (LDMOS) device. The LDMOS device includes an embedded bipolar junction transistor. The gate, the source, the buried layer lead-out area, and the substrate lead-out area of the LDMOS device are grounded. The drain and the body region lead-out area of the LDMOS device are electrically connected to a pad input/output terminal.

The following description, together with the accompanying drawings, will provide a better understanding of the nature and advantages of the claimed invention.

BRIEF DESCRIPTION OF THE DRAWINGS

FIG. 1A illustrates a schematic cross sectional view of a conventional gate-grounded N-type lateral double diffused insulated gate field effect transistor (GGNLDMOS).

FIG. 1B shows an equivalent circuit diagram for the GGNLDMOS shown in FIG. 1A.

FIG. 1C shows an equivalent circuit diagram for a conventional electrostatic discharge protection structure in a GGMOS device.

DETAILED DESCRIPTION OF THE INVENTION

Figure 2A:
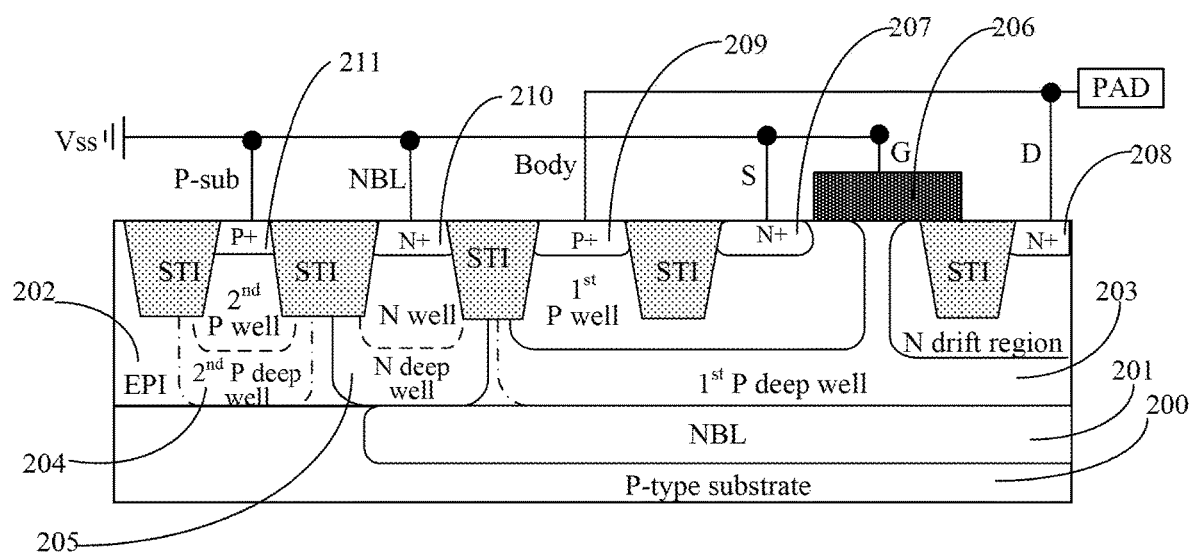
FIG. 2A illustrates a schematic cross sectional view of an electrostatic discharge protection structure according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," "directly disposed on," "directly connected to," or "directly coupled to" another element or layer, there are no intervening elements or layers present between them. It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc., do not denote any order, but rather the terms first, second, etc. are used to distinguish one element from another. Furthermore, the use of the terms a, an, etc., does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

Figure 2B:
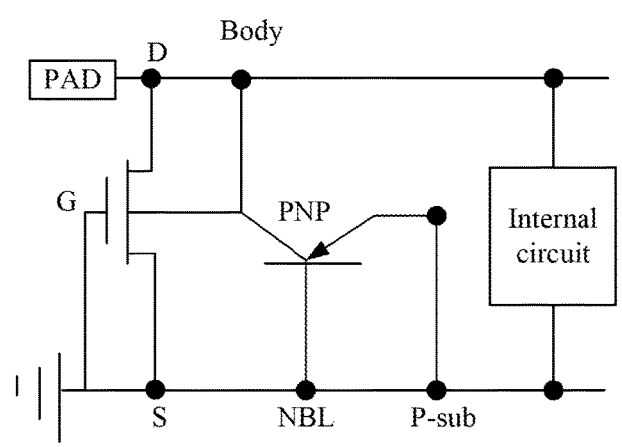
FIG. 2B shows an equivalent circuit diagram for the electrostatic discharge protection structure shown in FIG. 2A.

With reference to FIGS. 2A and 2B, an electrostatic discharge (ESD) protection structure according to an embodiment of the present invention will be described in detail.

The electrostatic discharge protection structure includes an LDMOS device. The LDMOS device includes an embedded bipolar junction transistors (BJT). The gate, the source, the buried layer lead-out area, and the substrate lead-out area of the LDMOS device are grounded. The drain and the body region lead-out area of the LDMOS are electrically connected to the pad input/output terminal (shown as "PAD" in FIG. 2A). In an embodiment, the bipolar junction transistor is a PNP transistor.

With reference to FIG. 2A, the LDMOS device is an NLDMOS, according to an embodiment.

The NLDMOS device includes a P-type substrate 200, an N-type buried layer (NBL) 201 formed in the P-type substrate 200, and an epitaxial (EPI) layer 202 formed above the N-type buried layer 201. The NLDMOS device further includes an N deep well 205, a first P deep well 203, and a second P deep well 204 formed in the epitaxial layer 202. The NLDMOS device further includes a first P well and an N drift region formed in the first P deep well 203. The first P well is a P-type body region. The NLDMOS device further includes a P+ body region lead-out area 209 and an N+ source 207 formed in the first P well. The P+ body region lead-out area 209 provides an ohmic contact for the P-type body region. The NLDMOS device further includes an N+ drain 208 formed in the N drift region, an N well formed in the N deep well 205, and an N+ buried layer lead-out area 210 formed in the N well. The N+ buried layer lead-out area 210 provides the ohmic contact for the N-type buried layer 201. The NLDMOS device further includes a second P well formed in the second P deep well 204, and a P+ substrate lead-out area 211 formed in the second P well. The P+ substrate lead-out area 211 provides the ohmic contact for the P-type substrate 200. The NLDMOS device further includes a gate 206 located between the first P well and the N-type drift region and above the surface of the epitaxial (EPI) layer 202. The gate 206, the N+ source 207, the N+ buried layer lead-out area 210, and the P+ substrate lead-out area 211 are grounded. The N+ drain 208 and the P+ body region lead-out area 209 are electrically connected to the pad input/output terminal. FIG. 2A shows only a portion of the NLDMOS device structure, which may also include a portion that is a mirror image of the portion shown in FIG. 2A.

FIG. 2B shows an equivalent circuit diagram of the electrostatic discharge protection structure shown in FIG. 2A. As can be seen, the electrostatic discharge protection structure may be considered to be equivalent to two transistors, namely an embedded PNP bipolar junction transistors and a GGNMOS transistor.

The P+ body region lead-out area 209 serves as the collector of the PNP transistor. The N+ buried layer lead-out area 210 serves as the base of the PNP transistor. The P+ substrate lead-out area 211 serves as the emitter of the PNP transistor. The PNP transistor is operative to transmit a reverse ESD current. The embedded PNP transistor can significantly improve the device's capacity to transmit reverse ESD currents.

The N+ drain 208, the gate 206, the N+ source 207, and the P+ substrate lead-out area 211 form the GGNMOS. The GGNMOS is operative to transmit a forward ESD current.

The electrostatic discharge protection structure according to an embodiment of the present invention does not require additional mask in the manufacturing process. It can be implemented on the basis of the existing NLDMOS structure without increasing the chip size.

According to an embodiment of the present invention, an electrostatic discharge protection structure includes an embedded PNP transistor in the NLDMOS device for transmitting a reverse ESD current, while the drain, the gate, the source, and the P+ substrate lead-out area constitute a GGNMOS for transmitting a forward ESD current, thereby achieving protection against electrostatic discharge currents in both directions. Therefore, the electrostatic discharge protection structure according to an embodiment of the present invention provides better ESD protection in the NLDMOS device.

Second Embodiment

According to another embodiment of the present invention, an electronic apparatus is provided. The electronic apparatus includes the electrostatic discharge protection structure described above, and an electronic component assembly coupled to the electrostatic discharge protection structure.

The electrostatic discharge protection structure includes an LDMOS device. The LDMOS device includes an embedded bipolar junction transistors. The gate, the source, the buried layer lead-out area, and the substrate lead-out area of the LDMOS device are grounded. The drain and the body region lead-out area of the LDMOS device are electrically connected to the pad input/output terminal. According to an embodiment, the bipolar junction transistor is a PNP transistor. The LDMOS device is an NLDMOS device.

Since the electrostatic discharge protection structure provides better ESD protection, the electronic apparatus also has the advantages described above.

The electronic apparatus may be a mobile phone, tablet PCs, laptops, netbooks, game consoles, TV receiver, VCD player, DVD player, GPS, camera, video camera, voice recorder, MP3, MP4, PSP players, or any other electronic products or equipment. It can also be an intermediate product having the above semiconductor device, for example: a mobile phone motherboard and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. An electrostatic discharge protection structure comprising:
   a laterally diffused metal oxide semiconductor (LDMOS) device, the LDMOS device comprising an embedded PNP bipolar junction transistor, wherein
   a gate, a source, a buried layer lead-out area, and a substrate lead-out area of the LDMOS device are connected to a ground,
   a drain and a body region lead-out area of the LDMOS device are directly connected to a pad input/output terminal, wherein the source, the body region lead-out area, the buried layer lead-out area, and the substrate lead-out area are arranged sequentially away from the gate and isolated from each other by a STI structure,
   the embedded PNP bipolar junction transistor is operative to transmit a reverse electrostatic discharge current while the drain, the gate, the source, and the substrate lead-out area form a grounded-gate NMOS (GGNMOS) being operative to transmit a forward electrostatic discharge current,
   a base and an emitter of the embedded PNP bipolar junction transistor are directly connected to the ground, and
   the LDMOS device comprises:
   a P-type substrate;
   an N-type buried layer formed in the P-type substrate;
   an epitaxial layer formed on the N-type buried layer;
   an N deep well, a first P deep well, and a second P deep well formed in the epitaxial layer;

a first P well and an N-type drift region completely embedded in the first P deep well, the first P well and the N-type drift region separated from each other;

a P+ body region lead-out area and an N+ source formed in the first P well;

an N+ drain formed in the N-type drift region;

an N well completely embedded in the N deep well;

an N+ buried layer lead-out area formed in the N well;

a second P well completely embedded in the second P deep well;

a P+ substrate lead-out area formed in the second P well; and a gate electrode formed on the epitaxial layer between the first P well and the N-type drift region.

2. The electrostatic discharge protection structure of claim 1, wherein the LDMOS device comprises an n-type LDMOS device.

3. The electrostatic discharge protection structure of claim 1, wherein the P+ body region lead-out area forms a collector of the PNP bipolar junction transistor, the N+ buried layer lead-out area forms the base of the PNP bipolar junction transistor, and the P+ substrate lead-out area forms the emitter of the PNP bipolar junction transistor.

4. The electrostatic discharge protection structure of claim 1, wherein:

the N-type drift region is formed in the first P deep well on a first side of the gate and the first P well is formed in the first P deep well on a second side of the gate opposite to the first side of the gate, the N deep well is further away from the gate than the first P well on the second side of the gate, and the second P deep well is further away from the gate than the N deep well on the second side of the gate.

5. An electronic apparatus comprising:

an electrostatic discharge protection structure; and an electronic component assembly coupled to the electrostatic discharge protection structure;

wherein the electrostatic discharge protection structure comprises a laterally diffused metal oxide semiconductor (LDMOS) device comprising an embedded PNP bipolar junction transistor, and wherein a gate, a source, a buried layer lead-out area, and a substrate lead-out area of the LDMOS device are connected to a ground, a drain and a body region lead-out area of the LDMOS device are directly connected to a pad input/output terminal, wherein the source, the body region lead-out area, the buried layer lead-out area, and the substrate lead-out area are arranged sequentially away from the gate and isolated from each other by a STI structure, the embedded PNP bipolar junction transistor is operative to transmit a reverse electrostatic discharge current while the drain, the gate, the source, and the substrate lead-out area form a grounded-gate NMOS (GGNMOS) being operative to transmit a forward electrostatic discharge current, and a base and an emitter of the embedded PNP bipolar junction transistor are directly connected to the ground, and wherein the LDMOS device comprises:

a P-type substrate;

an N-type buried layer formed in the P-type substrate;

an epitaxial layer formed on the N-type buried layer;

an N deep well, a first P deep well, and a second P deep well formed in the epitaxial layer;

a first P well and an N-type drift region completely embedded in the first P deep well, the first P well and the N-type drift region separated from each other;

a P+ body region lead-out area and an N+ source formed in the first P well;

an N+ drain formed in the N-type drift region;

an N well completely embedded in the N deep well;

an N+ buried layer lead-out area formed in the N well;

a second P well completely embedded in the second P deep well;

a P+ substrate lead-out area formed in the second P well; and a gate electrode formed on the epitaxial layer between the first P well and the N-type drift region.

6. The electrostatic discharge protection structure of claim 5, wherein the embedded PNP bipolar junction transistor comprises a collector connected to the pad input/output terminal.

7. The electronic apparatus of claim 5, wherein the P+ body region lead-out area forms a collector of the PNP bipolar junction transistor, the N+ buried layer lead-out area forms the base of the PNP bipolar junction transistor, and the P+ substrate lead-out area forms the emitter of the PNP bipolar junction transistor.

8. The electronic apparatus of claim 5, wherein the N+ drain, the gate, the N+ source, and the P+ substrate lead-out area form a grounded-gate NMOS (GGNMOS).

9. The electronic apparatus of claim 8, wherein the PNP bipolar junction transistor is operative to transmit a reverse electrostatic discharge current, and the GGNMOS is operative to transmit a forward electrostatic discharge current.

10. An electrostatic discharge protection structure, comprising:

a laterally diffused metal oxide semiconductor (LDMOS) device having an embedded PNP transistor, wherein the LDMOS device comprises a gate and a source both directly connected to a ground, and a drain directly connected to a pad input/output terminal, wherein the source, the body region lead-out area, the buried layer lead-out area, and the substrate lead-out area are arranged sequentially away from the gate and isolated from each other by a STI structure, the embedded PNP bipolar junction transistor is operative to transmit a reverse electrostatic discharge current while the drain, the gate, the source, and the substrate lead-out area form a grounded-gate NMOS (GGNMOS) being operative to transmit a forward electrostatic discharge current, and the embedded PNP transistor comprises a base and an emitter directly connected to the ground, wherein the LDMOS device comprises:

a P-type substrate;

an N-type buried layer formed in the P-type substrate;

an epitaxial layer formed on the N-type buried layer;

an N deep well, a first P deep well, and a second P deep well formed in the epitaxial layer;

a first P well and an N-type drift region completely embedded in the first P deep well, the first P well and the N-type drift region separated from each other;

a P+ body region lead-out area and an N+ source formed in the first P well;

an N+ drain formed in the N-type drift region;

an N well completely embedded in the N deep well;

an N+ buried layer lead-out area formed in the N well;

a second P well completely embedded in the second P deep well;

a P+ substrate lead-out area formed in the second P well; and a gate electrode formed on the epitaxial layer between the first P well and the N-type drift region.

11. The electrostatic discharge protection structure of claim 10, wherein:

the N+ buried layer lead-out area forms the base of the embedded PNP transistor;

the P+ substrate lead-out area forms the emitter of the embedded PNP transistor; and the P+ body region lead-out area forms a collector of the embedded PNP transistor.

12. The electrostatic discharge protection structure of claim 10, wherein the gate of the LDMOS device is disposed on the epitaxial layer between the first P well and the N-type drift region.

* * * * *